United States Patent

Ichinose et al.

(10) Patent No.: US 7,727,865 B2
(45) Date of Patent: Jun. 1, 2010

(54) METHOD FOR CONTROLLING CONDUCTIVITY OF $Ga_2O_3$ SINGLE CRYSTAL

(75) Inventors: Noboru Ichinose, Tokyo (JP); Kiyoshi Shimamura, Tokyo (JP); Kazuo Aoki, Tokyo (JP); Encarnacion Antonia Garcia Villora, Tokyo (JP)

(73) Assignee: Waseda University, Tokyo (JP)

( * ) Notice: Subject to any disclaimer, the term of this patent is extended or adjusted under 35 U.S.C. 154(b) by 0 days.

(21) Appl. No.: 10/589,852

(22) PCT Filed: Jan. 14, 2005

(86) PCT No.: PCT/JP2005/000420

§ 371 (c)(1),
(2), (4) Date: Nov. 27, 2006

(87) PCT Pub. No.: WO2005/078812

PCT Pub. Date: Aug. 25, 2005

(65) Prior Publication Data

US 2007/0166967 A1    Jul. 19, 2007

(30) Foreign Application Priority Data

Feb. 18, 2004  (JP)  ............... 2004-042170

(51) Int. Cl.
   *H01L 21/04* (2006.01)
(52) U.S. Cl. .................. 438/510; 438/514; 438/937; 257/E31.017; 257/E33.002
(58) Field of Classification Search ........... 438/510, 438/514, 937; 257/E31.017, E33.002
   See application file for complete search history.

(56) References Cited

U.S. PATENT DOCUMENTS 6,030,453 A  2/2000  Passlack et al.
6,897,560 B2  5/2005  Ota (Continued)

FOREIGN PATENT DOCUMENTS

JP   10-289906   10/1998

(Continued)

OTHER PUBLICATIONS

Harwig et al., "Electrical Properties of b-Ga2O3 Single Crystals. II," Journal of Solid State Chemistry vol. 23, pp. 205-211, Jan. 15, 1978.*

(Continued)

*Primary Examiner*—Ha Tran T Nguyen
*Assistant Examiner*—Daniel Whalen
(74) *Attorney, Agent, or Firm*—McGinn Intellectual Property Law Group, PLLC

(57) ABSTRACT

To provide a method of controlling a conductivity of a $Ga_2O_3$ system single crystal with which a conductive property of a $\beta$-$Ga_2O_3$ system single crystal can be efficiently controlled.

The light emitting element includes an n-type $\beta$-$Ga_2O_3$ substrate, and an n-type $\beta$-$AlGaO_3$ cladding layer, an active layer, a p-type $\beta$-$AlGaO_3$ cladding layer and a p-type $\beta$-$Ga_2O_3$ contact layer which are formed in order on the n-type $\beta$-$Ga_2O_3$ substrate. A resistivity is controlled to fall within the range of $2.0 \times 10^{-3}$ to $8 \times 10^2$ $\Omega$cm and a carrier concentration is controlled to fall within the range of $5.5 \times 10^{15}$ to $2.0 \times 10^{19}$/ $cm^3$ by changing a Si concentration within the range of $1 \times 10^{-5}$ to 1 mol %.

9 Claims, 3 Drawing Sheets

U.S. PATENT DOCUMENTS

| | | | |
|---|---|---|---|
| 6,977,397 | B2 | 12/2005 | Ichinose |
| 7,319,249 | B2 | 1/2008 | Ichinose |
| 2003/0107098 | A1 | 6/2003 | Ota et al. |
| 2004/0007708 | A1 | 1/2004 | Ichinose et al. |
| 2004/0113156 | A1* | 6/2004 | Tamura et al. ............... 257/79 |
| 2006/0150891 | A1* | 7/2006 | Ichinose et al. ............... 117/2 |

FOREIGN PATENT DOCUMENTS

| | | |
|---|---|---|
| JP | 10-338522 | 12/1998 |
| JP | 2002-093243 | 3/2002 |
| JP | 2004-056098 | 2/2004 |
| WO | WO 02/12598 | 2/2002 |

OTHER PUBLICATIONS

Ueda et al. "Synthesis and control of conductivity of ultraviolet transmitting b-Ga2O3 single crystals," Applied Physics Letters, Jun. 30, 1997, vol. 70, Issue 26, p. 3561 to 3563.*
International Search Report dated Apr. 26, 2005.
Harwig, T. et al., "Electrical Properties of B-Ga2O3 Single Crystals", In: Solid State Communication 1976, vol. 18, pp. 1223 to 1225.
Tomm, Y. et al., "Floating Zone Growth of B-Ga2O3: A New Window Material for Optoelectronic Device Applications", In: Solar Energy Materials & Cells, Feb. 2001, vol. 66, pp. 369 to 374.
Frank, J. et al., "Electrical Doping of Gas-Sensitive, Semiconducting Ga2O3 Thin Films", In: Sensors and Actuators B: Chemical, Aug. 1996, vol. 34, pp. 373 to 377.
Harwig, T. et al., "Electrical Properties of B-Ga2O3 Single Crystals. II", In: Journal of Solid State Chemistry, Jan. 15, 1978, vol. 23, pp. 205 to 211.
Harwig et al., "Electrical Properties of b-Ga2O3 Single Crystals. II," Journal of Solid State Chemistry vol. 23, pp. 205-211, Jan. 15, 1978. (Previously Submitted).
Ueda, N. et al., "Synthesis and Control of Conductivity of Ultraviolet Transmitting B-Ga2O3 Single Crystals", in Applied Physics Letters, Jun. 30, 1997, vol. 70, Issue 26, pp. 3561 to 3563. (Previously Submitted).
Tomm, Y. et al., "Floating Zone Growth of B-Ga2O3: A New Window Material for Optoelectronic Device Applications", In: Solar Energy Materials & Solar Cells, Feb. 2001, vol. 66, pp. 369 to 374. (Previously Submitted).
Frank J. et al., "electrical Doping of Gas-Sensitive, Semiconducting Ga2O3 Thin Films", In: Sensors and Actuators B: Chemical, Aug. 1996, Vol. 34, pp. 373 to 377. (Previously Submitted).
Harwig, T. et al., "Electrical Properties of B-Ga2O3 Single Crystals. II", In: Journal of Solid State Chemistry, Jan. 15, 1978, vol. 23, pp. 205 to 211. (Previously Submitted).
Japanese Office Action dated Aug. 5, 2008 with Partial English Translation.
Japanese Office Action dated Dec. 2, 2008 with English Tranlsation.
Harwig T. et al., "Electrical Properties of B-Ga2O3 Single Crystals.", Solid State Communications, 1976, vol. 18, pp. 1223-1225. (Previously Submitted).
Ueda, N. et al., "Synthesis and Control of Conductivity of Ultraviolet Transmitting B-Ga2O3 Single Crystals", in Applied Physics Letters, Jun. 30, 1997, vol. 70, Issue 26, pp. 3561 to 3563. (Previously Submitted).
Tomm, Y. et al., "Floating Zone Growth of B-Ga2O3: A New Window Material for Optoelectronic Device Applications", In: Solar Energy Materials & Solar Cells, Feb., 2001, vol. 66, pp. 369 to 374. (Previously Submitted).
Frank J. et al., "Electrical Doping of Gas-Sensitive, Semiconducting Ga2O3 Thin Films", In: Sensors and Actuators B: Chemical, Aug. 1996, vol. 34, pp. 373 to 377. (Previously Submitted).
Japanese Office Action dated Dec. 2, 2009 with English Tranlsation.
Japanese Office Action dated Mar. 24, 2009 with Partial English Translation.

* cited by examiner

METHOD FOR CONTROLLING CONDUCTIVITY OF $Ga_2O_3$ SINGLE CRYSTAL

TECHNICAL FIELD

The present invention relates to a method of controlling a conductivity of a $Ga_2O_3$ system single crystal, and more particularly to a method of controlling a conductivity of a $Ga_2O_3$ system single crystal with which a conductive property of a $Ga_2O_3$ system single crystal can be efficiently controlled.

BACKGROUND ART

A light emitting element in an ultraviolet region is greatly expected especially in realization of a mercury free fluorescent lamp, a photo catalyst providing a clean environment, a DVD of the new generation realizing higher density recording, and the like. From such a background, a GaN blue light emitting element is realized (for example, refer to a patent document 1).

The patent document 1 describes a light emitting element including a sapphire substrate, a buffer layer formed on the sapphire substrate, an n-type cladding layer formed of an n-type gallium nitride compound semiconductor layer and formed on the buffer layer, a non-doped active layer, a p-type cladding layer formed of a p-type gallium nitride compound semiconductor layer, and a p-type contact layer having a high carrier concentration. This conventional GaN blue light emitting element emits a light having an emission wavelength of 370 nm.

Patent document 1: Japanese Patent No. 2778405 (FIG. 1)

DISCLOSURE OF THE INVENTION

Problem to be Solved by the Invention

However, with the conventional GaN blue light emitting element, it is difficult to obtain a light emitting element which emits a light in an ultraviolet region having a shorter wavelength due to a band gap.

Then, in recent years, $\beta$-$Ga_2O_3$ has been expected as a material which may emit a light in an ultraviolet region because it has a larger band gap. A $\beta$-$Ga_2O_3$ bulk single crystal is obtained by utilizing a floating zone (FZ) method, and can be utilized as a semiconductor through wafer processing. The $\beta$-$Ga_2O_3$ bulk single crystal obtained by utilizing the FZ method shows an n-type conductive property.

Now, in the case where the $Ga_2O_3$ system single crystal is used in the form of a substrate or thin film, it is necessary to control a resistivity of the $Ga_2O_3$ system single crystal when a conductive property is required. However, heretofore, it has been difficult to widely control the resistivity because even if not being intentionally doped with an impurity, a substrate or thin film made of the $Ga_2O_3$ system single crystal has shown the n-type conductive property.

On the other hand, in spite of necessity for a high insulating property, conventionally, it has been difficult to make a substrate or thin film made of the $Ga_2O_3$ system single crystal having a high insulating property. Thus, in order to enhance the insulating property by reducing an oxygen-defect concentration, for example, it has been necessary to perform annealing at 900° C. for six days in the air.

Therefore, it is an object of the present invention to provide a method of controlling a conductivity of a $Ga_2O_3$ system single crystal with which a conductive property of the $Ga_2O_3$ system single crystal can be efficiently controlled.

Moreover, it is another object of the present invention to provide a method of controlling a conductivity of a $Ga_2O_3$ system single crystal with which the $Ga_2O_3$ system single crystal having a high insulating property can be made.

Means for Solving Problem

In order to attain the above-mentioned objects, the present invention provides a method of controlling a conductivity of a $Ga_2O_3$ system single crystal, characterized in that: a desired resistivity is obtained by adding a predetermined dopant to the $Ga_2O_3$ system single crystal.

The predetermined dopant is preferably a group IV element which decreases a resistance of the $Ga_2O_3$ system single crystal.

The group IV element is preferably Si, Hf, Ge, Sn, Ti or Zr.

A value of $2.0 \times 10^{-3}$ to $8.0 \times 10^2$ $\Omega$cm is preferably obtained as the desired resistivity by adding a predetermined amount of group IV element.

A carrier concentration of the $Ga_2O_3$ system single crystal is preferably controlled to fall within a range of $5.5 \times 10^{15}$ to $2.0 \times 10^{19}$/cm$^3$ as a range of the desired resistivity.

The predetermined dopant is preferably a group II element which increases a resistance of the $Ga_2O_3$ system single crystal.

The group II element is preferably Mg, Be or Zn.

$1 \times 10^3$ $\Omega$cm or more is preferably obtained as the desired resistivity by adding a predetermined amount of group II element.

EFFECTS OF THE INVENTION

According to the method of controlling a conductivity of a $Ga_2O_3$ system single crystal, it is found out that an n-type conductive property is given by Si which is contained as an impurity in a process for growing a substrate or thin film made of the $Ga_2O_3$ system single crystal. Hence, the $Ga_2O_3$ system single crystal can be highly purified by removing Si, which makes it possible to change a resistivity in correspondence to a concentration of dopant added.

According to the method of controlling a conductivity of a $Ga_2O_3$ system single crystal, Si, Hf, Ge, Sn, Ti or Zr as the group IV element is used as the dopant. Hence, substitution of Ga for such a group IV element makes it possible to form a substrate or thin film showing an n-type conductivity.

According to the method of controlling a conductivity of a $Ga_2O_3$ system single crystal, it is possible to make a low-resistance substrate or thin film having a resistivity of $2.0 \times 10^{-3}$ to $8.0 \times 10^2$ $\Omega$cm as a desired resistivity. Hence, this low-resistance substrate or thin film can be used as any of substrates or thin films of the various light emitting elements.

According to the method of controlling a conductivity of a $Ga_2O_3$ system single crystal, the carrier concentration of the $Ga_2O_3$ system single crystal can be controlled to fall within the range of $5.5 \times 10^{15}$ to $2.0 \times 10^{19}$/cm$^3$, and thus can be set to desired one. As a result, it is possible to unify the electrical characteristics of the light emitting elements.

According to the method of controlling a conductivity of a $Ga_2O_3$ system single crystal, Mg, Be or Zn as the group II element can be used as the dopant, and thus the $Ga_2O_3$ system single crystal can be readily made to have the insulating property. As a result, the $Ga_2O_3$ system single crystal can be used in any of applications each requiring the insulating property.

According to the method of controlling a conductivity of a $Ga_2O_3$ system single crystal, it is possible to obtain a $Ga_2O_3$ system single crystal substrate having a high resistivity of $1.0 \times 10^3$ Ωcm or more as the desired resistivity by adding the group II element to the $Ga_2O_3$ system single crystal.

Figure 1:
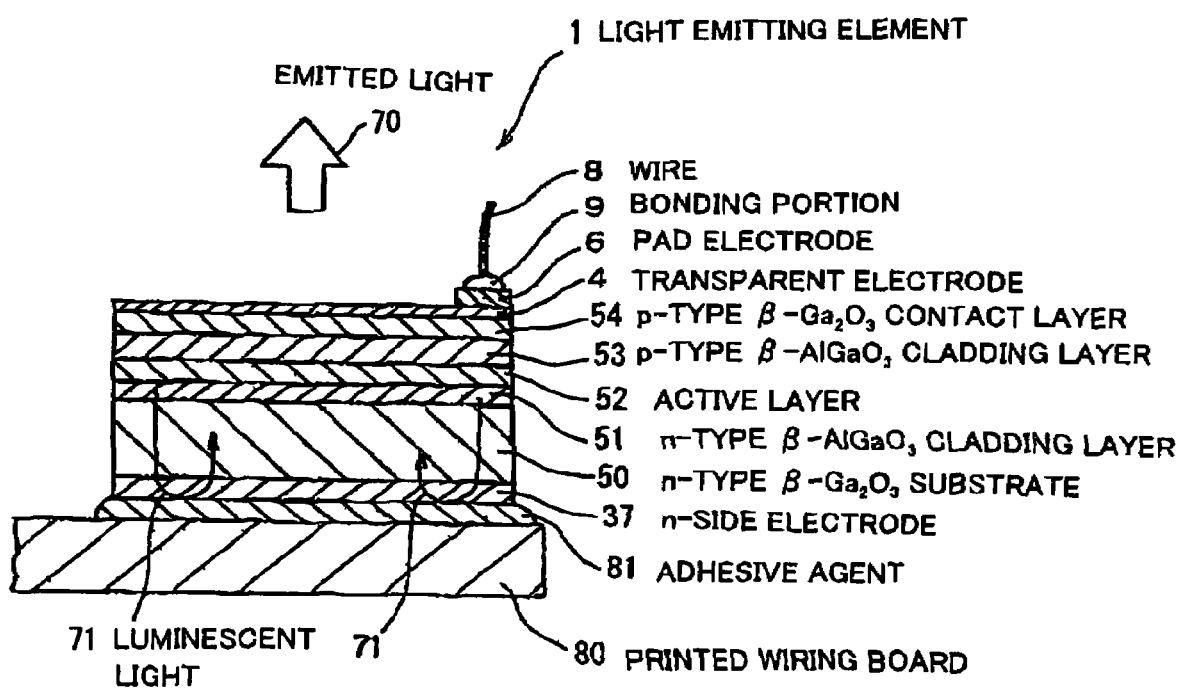
[FIG. 1] A cross sectional view of a light emitting element according to a first embodiment mode of the present invention.

DESCRIPTION OF REFERENCE NUMERALS 1 light emitting element
2 n-type $\beta$-$Ga_2O_3$ substrate
4 transparent electrode
5 electrode
6 pad electrode
8 wire
9 bonding layer
37 n-side electrode
50 n-type $\beta$-$Ga_2O_3$ substrate
51 n-type $AlGaO_3$ cladding layer
52 $\beta$-$Ga_2O_3$ active layer
53 p-type $\beta$-$Ga_2O_3$ cladding layer
54 p-type $\beta$-$Ga_2O_3$ contact layer
55 insulation type $\beta$-$Ga_2O_3$ substrate
56 n-type $\beta$-$Ga_2O_3$ contact layer
58 wire
59 bonding portion
70 emitted light
71 luminescent light
80 printed wiring board
81 adhesive agent

BEST MODE FOR CARRYING OUT THE INVENTION

FIG. 1 shows a light emitting element according to a first embodiment mode of the present invention. In the light emitting element 1, an n-type $\beta$-$AlGaO_3$ cladding layer 51 showing an n-type conductive property, an active layer 52 made of $\beta$-$Ga_2O_3$, a p-type $\beta$-$AlGaO_3$ cladding layer 53 showing a p-type conductive property, and a p-type $\beta$-$Ga_2O_3$ contact layer 54, made of a $\beta$-$Ga_2O_3$ single crystal, showing the p-type conductive property are laminated in order on an n-type $\beta$-$Ga_2O_3$ substrate 50, made of a $\beta$-$Ga_2O_3$ single crystal, showing the n-type conductive property.

In addition, the light emitting element 1 includes a transparent electrode 4 formed on an upper surface of the p-type $\beta$-$Ga_2O_3$ contact layer 54, a pad electrode 6 formed on a part of an upper surface of the transparent electrode 4, and an n-side electrode 37 formed over a lower surface of the n-type $\beta$-$Ga_2O_3$ substrate 50. The pad electrode 6, for example, is made of Pt. A wire 8 is bonded to the pad electrode 6 through a bonding portion 9. The n-side electrode 37, for example, is made of Au.

The light emitting element 1 is mounted to a printed wiring board 80 through an adhesive agent 81 or a metal paste and is connected to a printed wiring (not shown).

Here, the p-type $\beta$-$AlGaO_3$ cladding layer 53 and the p-type $\beta$-$Ga_2O_3$ contact layer 54 are formed such that a carrier concentration of the p-type $\beta$-$Ga_2O_3$ contact layer 54 becomes higher than that of the p-type $\beta$-$AlGaO_3$ cladding layer 53. In addition, similarly, the n-type $\beta$-$Ga_2O_3$ substrate 50 and the n-type $\beta$-$AlGaO_3$ cladding layer 51 are formed such that a carrier concentration of the n-type $\beta$-$Ga_2O_3$ substrate 50 becomes higher than that of the n-type $\beta$-$AlGaO_3$ cladding layer 51.

The $\beta$-$Ga_2O_3$ active layer 52 is sandwiched between the n-type $\beta$-$AlGaO_3$ cladding layer 51 and the p-type $\beta$-$AlGaO_3$ cladding layer 53, and thus double hetero junction is obtained therein. The active layer 52 is made of $\beta$-$Ga_2O_3$ which has a smaller band gap than that of each of the cladding layers 51 and 53.

This embodiment mode will be described hereinafter.

(1) Making of $\beta$-$Ga_2O_3$ Substrate Showing n-Type Conductivity and Control for Conductivity Thereof In order that the substrate may show an n-type conductive property, an n-type dopant needs to be substituted for Ga contained in the substrate. Si, Hf, Ge, Sn, Ti and Zr are given as gallium substitution n-type dopants any one of which is substituted for Ga.

The substrate showing an n-type conductive property is made as follows. Firstly, a $\beta$-$Ga_2O_3$ single crystal is formed by utilizing the FZ method. That is to say, a $\beta$-$Ga_2O_3$ seed crystal, and a $\beta$-$Ga_2O_3$ polycrystalline raw material containing therein Hf, Si or the like as an n-type dopant are separately prepared. The $\beta$-$Ga_2O_3$ seed crystal and the $\beta$-$Ga_2O_3$ polycrystalline raw material are then made to contact each other in a silica tube. Contacting portions of the $\beta$-$Ga_2O_3$ seed crystal and the $\beta$-$Ga_2O_3$ polycrystalline raw material are then heated to be molten. When the molten $\beta$-$Ga_2O_3$ polycrystalline raw material is crystallized together with the $\beta$-$Ga_2O_3$ seed crystal, the $\beta$-$Ga_2O_3$ single crystal containing therein Hf or Si as the n-type dopant is made on the $\beta$-$Ga_2O_3$ seed crystal. Next, the resulting $\beta$-$Ga_2O_3$ single crystal is subjected to processing such as cutting, thereby obtaining the substrate showing the n-type conductive property which is obtained in accordance with the conductivity control. Here, the $\beta$-$Ga_2O_3$ polycrystalline raw material is used which contains therein Si as an impurity having a low concentration, and thus has high purity of, for example, 6N.

A method of controlling a concentration of an n-type dopant containing therein Hf, Si or the like by utilizing the FZ method is given as a method of controlling a conductivity of a substrate, made of $\beta$-$Ga_2O_3$, showing the n-type conductive property.

(2) Making of Thin Film Showing n-Type Conductive Property and Control for Conductivity Thereof A thin film showing the n-type conductive property can be formed by utilizing a physical vapor-phase growth such as a Pulsed Laser Deposition (PLD) method, a Molecular Beam Epitaxy (MBE) method, a Metal Organic Vapor Deposition (MOCVD) method or a sputtering method, or a chemical vapor-phase growth such as a thermal Chemical Vapor Deposition (CVD) or a plasma CVD.

Thin film deposition made by utilizing the PLD method will now be described. In order that the thin film may show the n-type conductive property, at least an n-type dopant needs to be substituted for Ga contained in the thin film. Si, Hf, Ge, Sn, Ti and Zr are given as gallium substitution n-type dopants any one of which is substituted for Ga.

With regard to a method of doping a thin film with a gallium substitution n-type dopant by utilizing the PLD method, there is known a method using a target including a sintered body of $\beta$-$Ga_2O_3$ and an oxide of an n-type dopant, or a method using a solid solution single crystal of $\beta$-$Ga_2O_3$ and an oxide of an n-type dopant.

With regard to a method of controlling a conductivity of a thin film, made of β-Ga$_2$O$_3$, showing an n-type conductive property by utilizing the PLD method, there is known a method of changing a component ratio of an oxide of an n-type dopant to β-Ga$_2$O$_3$.

Figure 2:
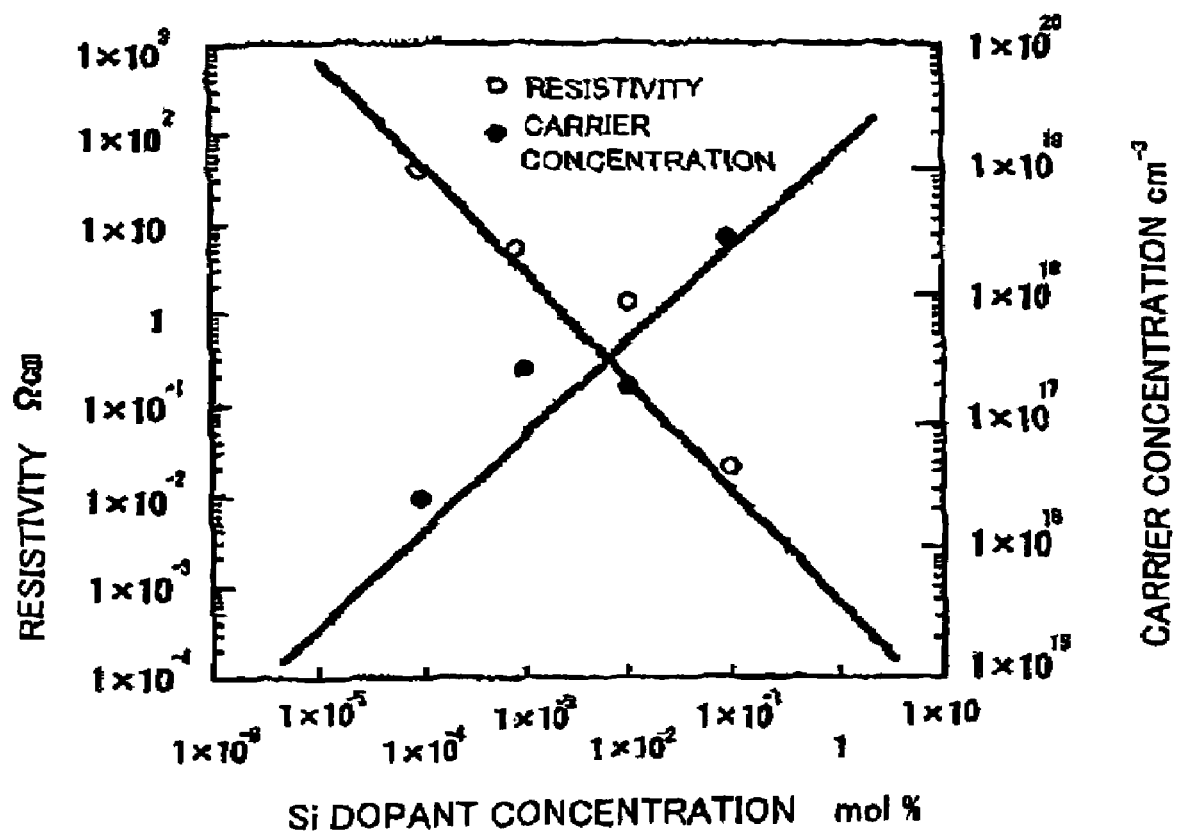
[FIG. 2] A diagram showing a relationship among a dopant concentration, a carrier concentration and a resistivity when Si is used as an n-type dopant.

FIG. 2 shows a relationship among a dopant concentration, a carrier concentration, and a resistivity when Si is used as an n-type dopant. The Si concentration, for example, is changed within the range of $1 \times 10^{-5}$ to 1 mol %, which results in that the resistivity takes values in the range of $2.0 \times 10^{-3}$ to $8 \times 10^{2}$ Ωcm, and the carrier concentration takes values in the range of $5 \times 10^{15}$ to $2.0 \times 10^{19}$/cm$^3$. From this, control for the dopant concentration makes it possible to change the resistivity and the carrier concentration. Here, the reason that the low carrier concentration of $5.5 \times 10^{15}$/cm$^3$ is obtained is because the β-Ga$_2$O$_3$ polycrystalline raw material having high purity of 6N is used, a system implementing the FZ method or PLD method is installed in a so-called clean room, a clean gas, a clean instrument and the like are used as necessary ones, and so forth.

It was confirmed that of the n-type dopants described above, especially, each of Hf, Si and Sn shows the satisfactory control property.

(3) Method of Making Thin Film Showing p-Type Conductive Property

A thin film showing a p-type conductive property can be deposited by utilizing the physical vapor-phase growth such as the PLD method, the MBE method or the MOCVD method, or the chemical vapor-phase growth such as the thermal CVD, or the plasma CVD.

Thin film deposition made by utilizing the PLD method will now be described. In order that the thin film may show the p-type conductive property, a p-type dopant needs to be substituted for Ga contained in the thin film, a p-type dopant needs to be substituted for oxygen contained in the thin film, or the showing of the p-type conductivity needs to rely on Ga defects.

H, Li, Na, K, Rb, Cs, Fr, Be, Mg, Ca, Sr, Ba, Ra, Mn, Fe, Co, Ni, Pd, Cu, Ag, Au, Zn, Cd, Hg, Tl, Pb and the like are given as gallium substitution p-type dopants any one of which is substituted for Ga. P and the like are given as oxygen substitution p-type dopants any one of which is substituted for oxygen.

Each of a method of doping a thin film with the gallium substitution p-type dopant by utilizing the PLD method and a method of doping a thin film with the oxygen substitution p-type dopant is a method of doping a thin film with a p-type dopant in a thin film growing process. With regard to a method of doping a thin film with a p-type dopant, the following method is known. That is to say, there is known a method using a target made of an alloy of Ga and a p-type dopant, a method using a target including a sintered body of β-Ga$_2$O$_3$ and an oxide of a p-type dopant, a method using a target made of a solid solution single crystal of β-Ga$_2$O$_3$ and an oxide of a p-type dopant, a method using a target made of a Ga metal and a target made of a p-type dopant, or the like.

In addition, the thin film showing the p-type conductive property relying on the Ga defects can be made such that it is deposited in an ambient atmosphere of N$_2$O obtained through radicalization by a plasma gun by using a Ga metal, a β-Ga$_2$O$_3$ sintered body, or a β-Ga$_2$O$_3$ crystal (single crystal or polycrystalline) as a target.

(5) Electrode

An electrode is made of a material with which ohmic contact is obtained. For example, a metal simple substance such as Au, Al, Ti, Sn, Ge, In, Ni, Co, Pt, W, Mo, Cr, Cu or Pb, an alloy containing therein at least two kinds of metal simple substances of them (for example, an Au—Ge alloy), a two-layer structure thereof (for example, Al/Ti, Au/Ni, or Au/Co), or ITO is used in the thin film or substrate showing the n-type conductive property. A metal simple substance such as Au, Al, Be, Ni, Pt, In, Sn, Cr, Ti or Zn, an alloy containing therein at least two kinds of metal simple substances of them (for example, an Au—Zn alloy or an Au—Be alloy), a two layer structure thereof (for example, Ni/Au), or ITO is used in the thin film or substrate showing the p-type conductive property.

The light emitting element according to the first embodiment mode of the present invention offers the following effects.

(i) Since the resistivity and the carrier concentration can be changed by controlling the dopant concentration, it is possible to make the thin film or substrate having the desired carrier concentration.

(ii) A substrate resistance of the light emitting element 1 becomes small, which results in reduction of a forward voltage Vf.

(iii) Since the n-type β-Ga$_2$O$_3$ substrate 50 has the conductive property, a vertical construction can be adopted such that the electrodes are extracted from upper and lower sides of the substrate. As a result, it is possible to simplify the layer structure and the fabrication processes.

(iv) A luminescent light penetrates through the transparent electrode 4 to be emitted in the form of the emitted light 70, which is emitted upward, to the outside. In addition thereto, a luminescent light 71 which is propagated to the lower surface of the n-type β-Ga$_2$O$_3$ substrate 50, for example, is reflected by the n-side electrode 37 or the adhesive agent 81 to be emitted upward. Hence, the luminous intensity increases as compared with the case where only the emitted light 70 is emitted.

Figure 3:
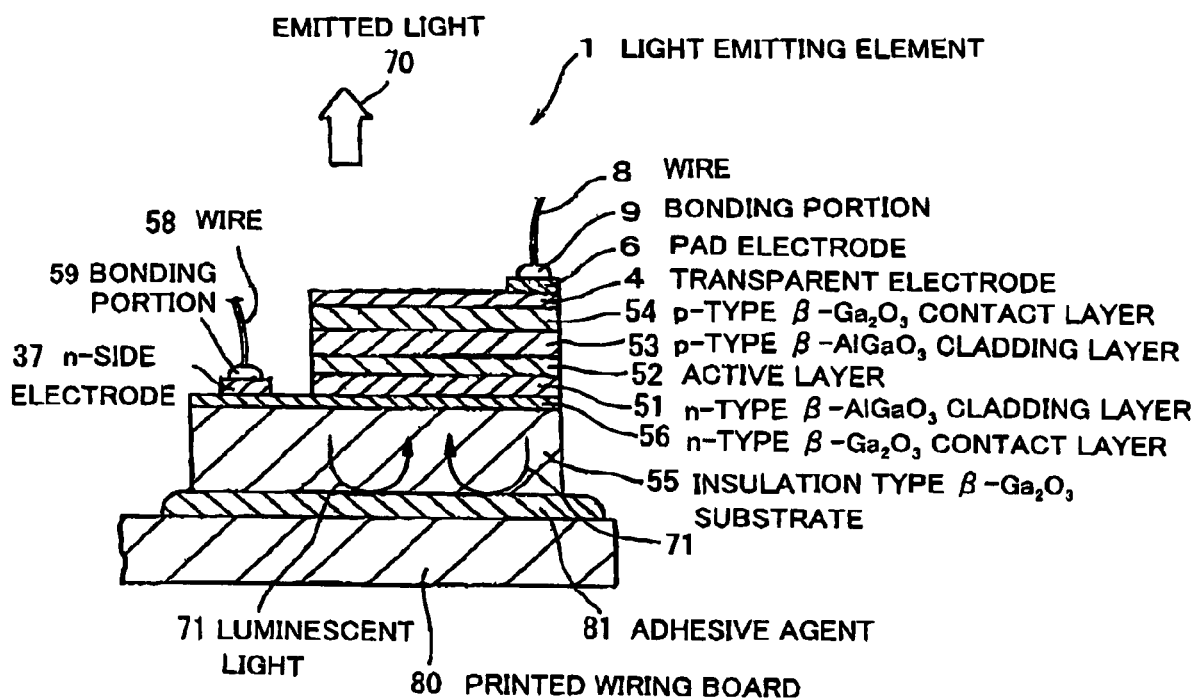
[FIG. 3] A cross sectional view of a light emitting element according to a second embodiment mode of the present invention.

FIG. 3 shows a light emitting element according to a second embodiment mode of the present invention. In the light emitting element 1, an n-type β-Ga$_2$O$_3$ contact layer 56, made of a β-Ga$_2$O$_3$ single crystal, showing an n-type conductive property, an n-type β-AlGaO$_3$ cladding layer 51, an active layer 52 made of β-Ga$_2$O$_3$, a p-type β-AlGaO$_3$ cladding layer 53 showing a p-type conductive property, and a p-type β-Ga$_2$O$_3$ contact layer 54, made of the β-Ga$_2$O$_3$ single crystal, showing the p-type conductive property are laminated in order on an insulation type β-Ga$_2$O$_3$ substrate 55 made of the β-Ga$_2$O$_3$ single crystal.

In addition, the light emitting element 1 includes a transparent electrode 4 formed on the p-type β-Ga$_2$O$_3$ contact layer 54, a pad electrode 6 formed on a part of the transparent electrode 4, and an n-side electrode 37 formed on the n-type β-Ga$_2$O$_3$ contact layer 56. The pad electrode 6, for example, is made of Pt, and a wire 8 is connected to the pad electrode 6 through a bonding portion 9. The n-side electrode 37, for example, is made of Au, and a wire 58 is connected to the n-side electrode 37 through a bonding portion 59.

The light emitting element 1 is installed on a printed wiring board 80 through an adhesive agent 81 or a metal paste, and is connected to a printed wiring (not shown) of the printed wiring board 80.

Here, the p-type β-AlGaO$_3$ cladding layer 53 and the p-type β-Ga$_2$O$_3$ contact layer 54 are formed such that a carrier concentration of the p-type β-Ga$_2$O$_3$ contact layer 54 becomes higher than that of the p-type β-AlGaO$_3$ cladding layer 53. In addition, the n-type β-AlGaO$_3$ cladding layer 51 and the n-type β-Ga$_2$O$_3$ contact layer 56 are formed such that a carrier concentration of the n-type β-Ga$_2$O$_3$ contact layer 56 becomes higher than that of the n-type β-AlGaO$_3$ cladding layer 51.

The β-Ga$_2$O$_3$ active layer 52 is sandwiched between the n-type β-AlGaO$_3$ cladding layer 51 and the p-type β-AlGaO$_3$ cladding layer 53 and thus double hetero junction is obtained therein. The β-Ga$_2$O$_3$ active layer 52 is made of β-Ga$_2$O$_3$ which has a smaller band gap than that of each of the cladding layers 51 and 53.

(6) Method of Making Insulation Type Substrate

The insulation type substrate is made as follows. Firstly, the FZ method is utilized similarly to the method of making the substrate showing the n-type conductive property. That is to say, a βGa$_2$O$_3$ seed crystal, and a high-purity β-Ga$_2$O$_3$ polycrystalline raw material containing therein Si as an impurity having a low concentration are separately prepared. The β-Ga$_2$O$_3$ seed crystal and the β-Ga$_2$O$_3$ polycrystalline raw material containing therein Mg, Be or Zn as a p-type dopant are then made to contact each other in a silica tube. Contacting portions of the β-Ga$_2$O$_3$ seed crystal and the β-Ga$_2$O$_3$ polycrystalline raw material are heated to be molten. When the molten β-Ga$_2$O$_3$ polycrystalline raw material is crystallized together with the β-Ga$_2$O$_3$ seed crystal, the β-Ga$_2$O$_3$ single crystal containing therein Mg is made on the β-Ga$_2$O$_3$ seed crystal. Next, the resulting β-Ga$_2$O$_3$ single crystal is subjected to the processing such as the cutting, thereby obtaining the substrate showing an insulating property. Here, when an amount of Mg added was 0.01 mol % and 0.05 mol %, a resistance value of the resulting substrate was 1,000 MΩ or more, and thus the resulting substrate showed the insulating property. Even when Be and Zn were individually added to the β-Ga$_2$O$_3$ single crystal, the β-Ga$_2$O$_3$ single crystal also showed the insulating property.

According to the second embodiment, the following effects are obtained.

(i) Since the addition of the p-type dopant makes it possible to make the thin film and the substrate each having the insulating property, it is possible to fabricate the light emitting element which employs the β-Ga$_2$O$_3$ single crystal and which has the MIS structure.

(ii) In this light emitting element 1, the substrate resistance of the light emitting element 1 becomes small, and thus the forward voltage Vf becomes small.

(iii) The wide band gap which the β-Ga$_2$O$_3$ system single forming the active layer 52 has allows the light having a short wavelength of, for example, 260 nm to be emitted.

(iv) Since each of the insulation type β-Ga$_2$O$_3$ substrate 55 and the n-type β-Ga$_2$O$_3$ cladding layer 51 is structured by mainly using β-Ga$_2$O$_3$, the buffer layer can be made unnecessary and the n-type layer having the excellent crystalline can be formed.

(v) Since the insulation type β-Ga$_2$O$_3$ substrate 55 has the high transmission property in the emission region, it is possible to increase the efficiency of leading out the light.

(vi) A luminescent light penetrates through the transparent electrode 4 to be emitted in the form of a light emitted upward to the outside. In addition thereto, a luminescent light 71 which is propagated to the lower surface of the insulation type β-Ga$_2$O$_3$ substrate 55, for example, is reflected by the adhesive agent 81 to be emitted upward. Consequently, the luminous intensity increases as compared with the case where the luminescent light 71 is directly emitted to the outside.

(vii) Since the oxide system β-Ga$_2$O$_3$ system single crystal is used in each of the insulation type β-Ga$_2$O$_3$ substrate, and the layers 51, 52, 54 and 56, it is possible to fabricate the light emitting element which stably operates even in the atmosphere at the high temperature.

(viii) Since flip chip bonding becomes possible for a method of connecting the light emitting element to the printed wiring board or the lead frame, the heat generated from the emission region can be efficiently discharged to the printed wiring board or to the lead frame.

Although in the first and second embodiment modes, the description has been given with respect to the case where β-Ga$_2$O$_3$ is used, any other type Ga$_2$O$_3$ may also be used.

In addition, although in the first and second embodiment modes, the light emitting element has been described, the present invention can also be applied to a photo sensor for converting an incident light into an electrical signal.

In addition, the active layer 52 may also be made of β-GaInO$_3$. At this time, the cladding layer may also be made of β-Ga$_2$O$_3$. In addition, the active layer 52 may have a quantum well structure with which the luminous efficiency can be enhanced.

INDUSTRIAL APPLICABILITY

According to the method of controlling a conductivity of a Ga$_2$O$_3$ system single crystal of the present invention, the Ga$_2$O$_3$ system single crystal can be highly purified by removing Si, and the resistivity thereof can be changed in correspondence to a concentration of a dopant added. This invention is utilized in fabrication of the light emitting element.

The invention claimed is:

1. A method of controlling a conductivity of a Ga$_2$O$_3$ system single crystal, comprising:
    adding an n-type dopant to the Ga$_2$O$_3$ system single crystal to change a resistivity of the Ga$_2$O$_3$ system single crystal substantially linearly with an added amount of the n-type dopant,
    wherein the n-type dopant comprises one of Zr, Si, Hf, Ge, Sn, and Ti,
    wherein the Ga$_2$O$_3$ system single crystal is prepared with a Ga$_2$O$_3$ polycrystalline raw material, and
    wherein the Ga$_2$O$_3$ polycrystalline raw material has a purity of 6N.

2. The method of controlling a conductivity of a Ga$_2$O$_3$ system single crystal according to claim 1, wherein a value of $2.0\times10^{-3}$ to $8.0\times10^2$ Ωcm is obtained as the resistivity by said adding said n-type dopant.

3. The method of controlling a conductivity of a Ga$_2$O$_3$ system single crystal according to claim 2, wherein a carrier concentration of the Ga$_2$O$_3$ system single crystal is controlled to fall within a range of $5.5\times10^{15}$ to $2.0\times10^{19}$ cm$^3$ as a range of the resistivity.

4. The method of controlling a conductivity of a Ga$_2$O$_3$ system single crystal according to claim 1, wherein the n-type dopant comprises one of Si, Hf, and Sn.

5. The method of controlling a conductivity of a Ga$_2$O$_3$ system single crystal according to claim 1, wherein the n-type dopant comprises one of Si and Hf.

6. A method of controlling a conductivity of a Ga$_2$O$_3$ system single crystal, comprising:
    contacting a Ga$_2$O$_3$ polycrystalline raw material comprising a predetermined dopant to a Ga$_2$O$_3$ seed crystal; and
    growing the Ga$_2$O$_3$ system single crystal on the Ga$_2$O$_3$ seed crystal such that said predetermined dopant is substituted for Ga in the Ga$_2$O$_3$ system single crystal to obtain a desired resistivity in the Ga$_2$O$_3$ system single crystal of $1\times10^3$ Ωcm or greater,
    wherein said predetermined dopant comprises a p-type dopant for controlling said conductivity of the Ga$_2$O$_3$ system single crystal, said p-type dopant comprising one of H, Li, Na, K, Rb, Cs, Fr, Be, Mg, Ca, Sr, Ba, Ra, Mn, Fe, Co, Ni, Pd, Cu, Ag, Au, Zn, Cd, Hg, Tl, and Pb, and
    wherein said Ga$_2$O$_3$ polycrystalline raw material has a purity of 6N.

7. The method of controlling a conductivity of a $Ga_2O_3$ system single crystal according to claim 6, wherein said conductivity of the $Ga_2O_3$ system single crystal is dependent on an added amount of said p-type dopant.

8. A method of manufacturing a $Ga_2O_3$ system single crystal, comprising:

adding an n-type dopant to the $Ga_2O_3$ system single crystal, said n-type dopant comprising one of Zr, Si, Hf, Ge, Sn, and Ti; and manufacturing the $Ga_2O_3$ system single crystal having a resistivity depending on an added amount of said n-type dopant by changing the resistivity of the $Ga_2O_3$ system single crystal substantially linearly with the added amount of said n-type dopant, wherein the $Ga_2O_3$ system single crystal is prepared with a $Ga_2O_3$ polycrystalline raw material, and wherein the $Ga_2O_3$ polycrystalline raw material has a purity of 6N.

9. The method of manufacturing a $Ga_2O_3$ system single crystal according to claim 8, wherein said n-type dopant comprises one of Si, Hf, and Sn.

* * * * *